United States Patent
Payne et al.

(10) Patent No.: US 10,014,899 B2
(45) Date of Patent: Jul. 3, 2018

(54) SYSTEM AND METHOD FOR BUILT-IN SELF-TEST OF ELECTRONIC CIRCUITS

(71) Applicant: TEXAS INSTRUMENTS INCORPORATED, Dallas, TX (US)

(72) Inventors: Robert Floyd Payne, Lucas, TX (US); Lambert Jacob Helleman, Voorschoten (NL)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 73 days.

(21) Appl. No.: 15/211,782

(22) Filed: Jul. 15, 2016

(65) Prior Publication Data

US 2018/0019781 A1   Jan. 18, 2018

(51) Int. Cl.
| H04B 1/40 | (2015.01) |
| G01R 31/28 | (2006.01) |
| H04B 17/00 | (2015.01) |
| H04L 7/02 | (2006.01) |

(52) U.S. Cl.
CPC ........... *H04B 1/40* (2013.01); *G01R 31/2884* (2013.01); *H04B 17/00* (2013.01); *H04L 7/02* (2013.01)

(58) Field of Classification Search
CPC ...... H04B 1/40; H04B 17/00; G01R 31/2884; H04L 7/02
See application file for complete search history.

(56) References Cited

U.S. PATENT DOCUMENTS

| 5,588,006 A | 12/1996 | Nozuyama |
| 7,525,348 B1 | 4/2009 | Ziazadeh |
| 8,686,736 B2 * | 4/2014 | Forstner ............. G01R 31/2822 324/537 |
| 2005/0240842 A1 | 10/2005 | Yonaga |
| 2010/0073220 A1* | 3/2010 | Olesen ................... H04B 17/00 342/174 |
| 2010/0251040 A1 | 9/2010 | Zerbe et al. |
| 2014/0298122 A1* | 10/2014 | Brambilla ............. G06F 11/267 714/724 |
| 2014/0333460 A1* | 11/2014 | Munnan ................ H03M 1/109 341/120 |
| 2015/0362967 A1* | 12/2015 | Tell ........................... G06F 1/10 711/103 |
| 2017/0030967 A1* | 2/2017 | Warnock ............ G01R 31/2896 |
| 2017/0115340 A1* | 4/2017 | Sung .................. G01R 31/2884 |

OTHER PUBLICATIONS

International Search Report for PCT/US2017/042403 dated Oct. 26, 2017.

* cited by examiner

*Primary Examiner* — Freshten N Aghdam

(74) *Attorney, Agent, or Firm* — Michael A. Davis, Jr.; Charles A. Brill; Frank D. Cimino

(57) ABSTRACT

In described examples of a device with built-in-self-test, a multiplexer has at least first and second input terminals and is coupled to receive a first input signal at the first input terminal, a second input signal at the second input terminal, and selection signals. Also, the multiplexer is coupled to output: the first input signal in response to a first combination of the selection signals; the second input signal in response to a second combination of the selection signals; and an analog summation of the first and second input signals in response to a third combination of the selection signals.

16 Claims, 6 Drawing Sheets

SYSTEM AND METHOD FOR BUILT-IN SELF-TEST OF ELECTRONIC CIRCUITS

TECHNICAL FIELD

This relates generally to electronic circuits, and more particularly to built-in self-test of electronic circuits.

BACKGROUND

Integrated circuits (ICs) may be designed and built with additional hardware and software configured to perform self-test. A built-in-self-test (BIST) system enables an integrated circuit to test its own functions and operations. In some cases, an integrated circuit does not need external automated self-test equipment to verify its functionality. Typically, BIST systems generate test signal patterns to run through the internal circuits of an IC and then collect the responses from various internal components to determine whether the response matches a predetermined expected response. High data rate ICs may especially benefit from careful characterization, production testing, and in-system debug capability. If specialized and expensive (e.g. typical cost >$100 k) bit error ratio testers and oscilloscopes are required, then such requirement limits the ability to use off the shelf, low-cost automated test equipment (ATE).

In many digital data communication applications, communication is bi-directional, and ICs that include a combination of a transmitter and receiver are used at both ends of a communication link. This combination is also known as a transceiver. In transceivers, a "loopback" test function provides a functional "at device speed" test. A BIST can generate test patterns for the transmitter that can be looped back to the receiver. This enables testing of the receiver function at device speed within the transceiver IC. In other digital communication applications using integrated circuits, communications are in a single direction where an upstream transmitter communicates to a downstream receiver. One common example is a video interface for a display device, which is a "receive only" device without transmission capability. Other devices include processors, video controllers, field programmable gate arrays (FPGA), or application specific integrated circuits (ASIC), which send data to display devices.

In transceiver systems, the loopback BIST function only provides a pass/fail indication and does not provide device margin measurements. In loopback functions, direct measurement of signals that a receiver actually receives is not practical, because the "loop" is completed within the device. The closest measurements that can be made are typically at external pads/pins of the device. These pads/pins can be probed, but additional signal degradation (such as reflections caused by plating stubs, bond wires and/or non-ideal termination) is not measured. For standalone receivers, challenges exist in testing receiver functions at the device speed, because the testing is conducted using external connections, which may introduce noise and other interference that skews the test results. In a high speed communications system, signal integrity of electrical signals is important for an error free, robust link.

FIG. 1 shows an example "data eye" diagram, which is useful to evaluate the performance of a communication link. In data eye diagram measurement, timing and voltage margins can be directly measured. This is typically done using a high speed oscilloscope connected to external boundaries or test connections (e.g., pins, balls or pads) of a packaged IC. As the eye becomes more "open" in the vertical direction, more voltage margin (measured as the amplitude of the eye) becomes available to the receiver. Similarly, as the "eye" becomes more open in the horizontal direction, more timing margin (measured as the width of the eye) becomes available to the receiver.

This measurement has several drawbacks. First, it uses an expensive oscilloscope, which may be unavailable in a test environment, and likewise may be unavailable in a completed or assembled system. Second, by measuring at the external boundary of the packaged IC, the data eye diagram does not provide a complete view of the device's internal functioning.

FIG. 2 shows an example circuit 200 with conventional methods of testing and measurements. Circuit 200 includes a receiver circuit 205 configured to receive data only (e.g., display unit). Circuit 200 further includes a transmitter 210. Transmitter 210 can be any circuit configured to transmit data downstream to the receiver 205. The data from transmitter 210 travels through transmission line 220 (e.g., circuit paths on a circuit board). The data is received by the receiver 205 at an entrance point 230 of the receiver 205 circuit package. The entrance point 230 can be any circuit connection, such as a pin grid array (PGA), land grid array (LGA), and similar other IC package connections. The IC package introduces parasitic inductance and capacitance 235 in the signal path. The signal further travels through the internal routings 240 of the receiver 205 and can introduce further signal abnormalities due to various factors, such as bond-wire inductance 250. The signal is eventually received in the IC at termination point 260. The termination point 260 can further introduce parasitic capacitance to the incoming signal resulting from electrostatic discharge (ESD) protection circuits, IC bond-pads, and the IC active circuitry in the receiver.

In conventional testing methods, signals are tested at the transmitter's exit points and the receiver's entry points, without measuring the voltage and timing margins inside the receiver 205 at the termination point 260. For example, when the signal is initially tested at the output of the transmitter 210, it may illustrate an ideal data eye diagram 270. However, when the measurements are conducted at the entry point 230 and termination point 260, the data eye diagram may be represented as shown in eye diagrams 280 and 290 respectively. This is due to further signal loss, reflections, filtering and equalization, resulting from non-idealities and electrical behavior of the IC package and/or the IC die. The data eye diagrams provide different margins for voltage and time at each signal point. As shown, conventional testing methods fail to provide data on the receiver's voltage and timing margins.

SUMMARY

In described examples of a device with built-in-self-test, a multiplexer has at least first and second input terminals and is coupled to receive a first input signal at the first input terminal, a second input signal at the second input terminal, and selection signals. Also, the multiplexer is coupled to output: the first input signal in response to a first combination of the selection signals; the second input signal in response to a second combination of the selection signals; and an analog summation of the first and second input signals in response to a third combination of the selection signals.

DETAILED DESCRIPTION OF EXAMPLE EMBODIMENTS

To measure signal integrity inside an IC package (where a receiver senses actual signals), example embodiments measure voltage and timing margins inside the IC package, even if a high speed data rate of the IC package exceeds capabilities of external test hardware.

In described examples of a system and method for testing an integrated circuit, the system includes a transmitter configured to provide internal programmable inputs, with ability to modify amplitude and clock phase of input test signals to identify errors and accurately determine the voltage and timing margins of the device.

Figure 1:
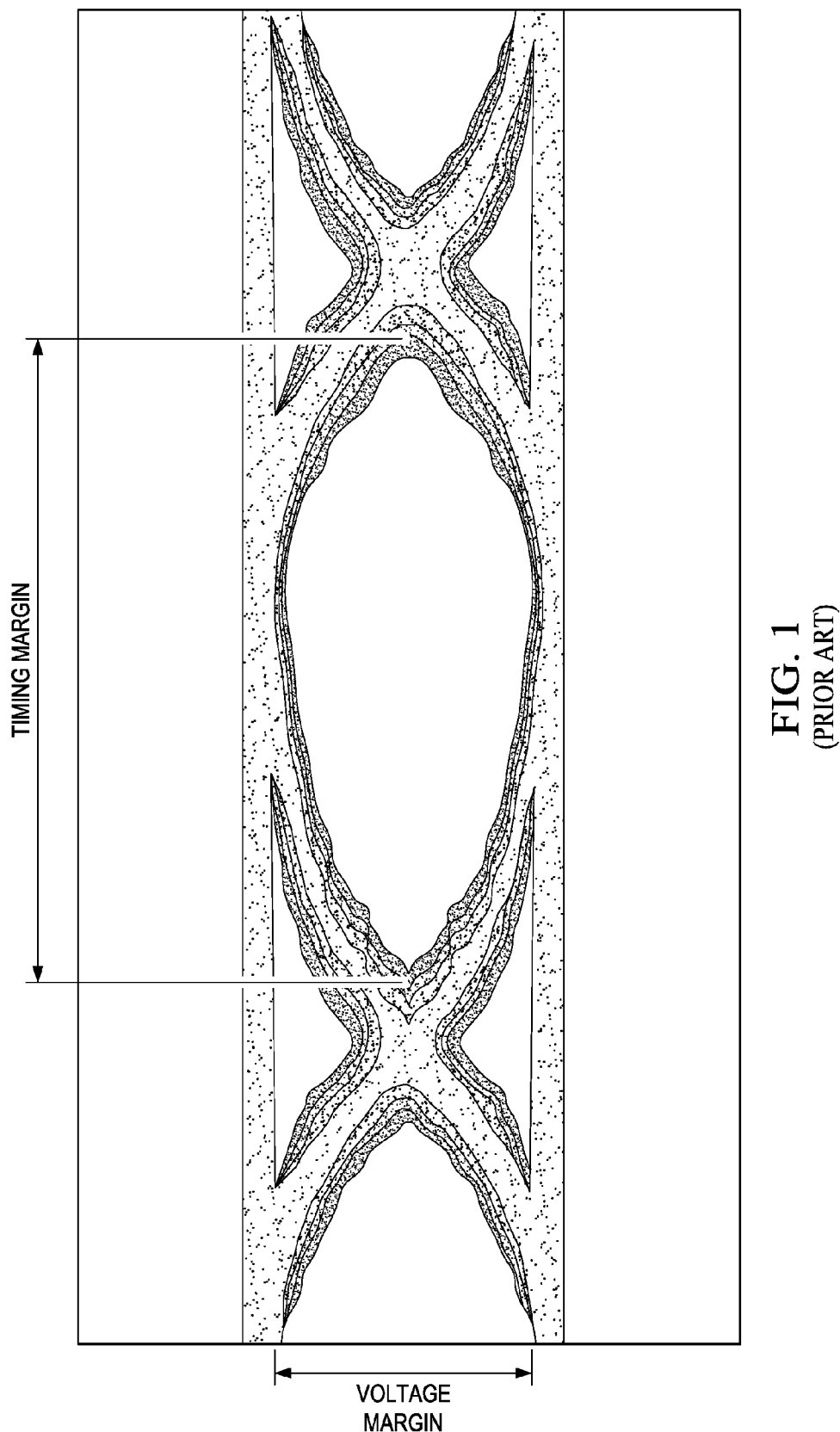
FIG. 1 (prior art) is an example "data eye" diagram.
Figure 2:
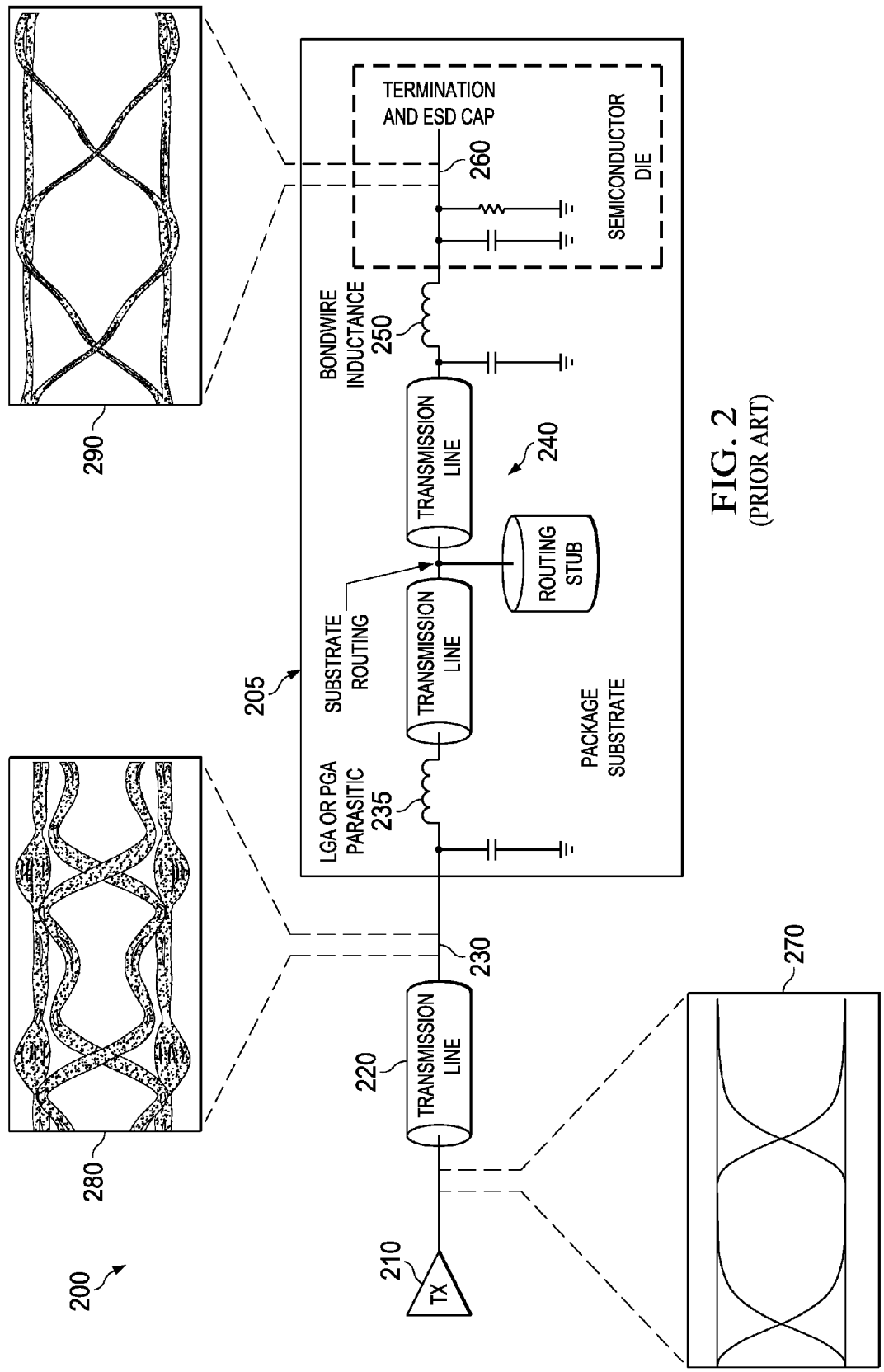
FIG. 2 (prior art) illustrates an example circuit with conventional methods of testing and measurements.
Figure 3A:
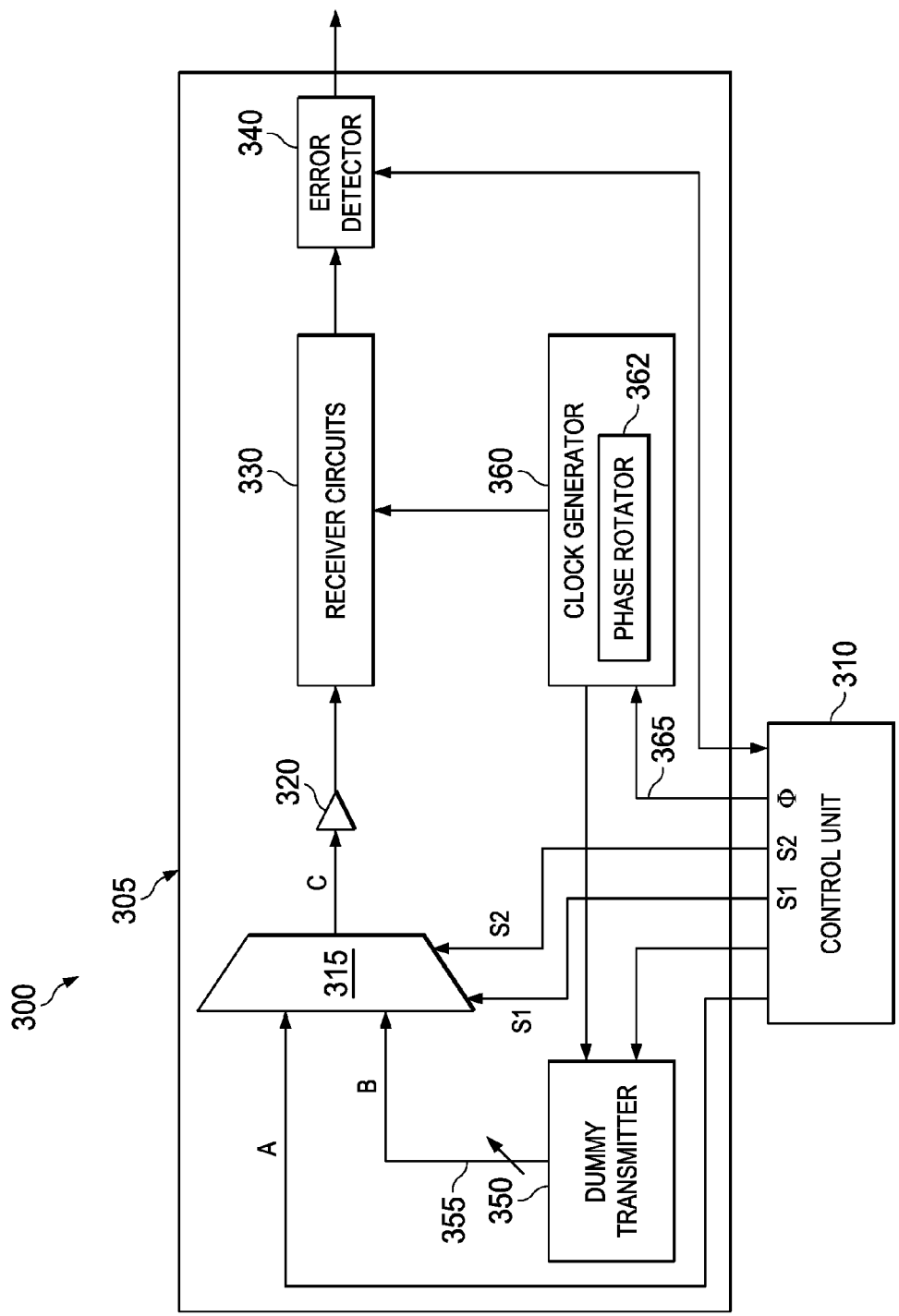
FIG. 3A is a block diagram of an example built-in self-test system according to an embodiment.

FIG. 3A shows an example built-in self-test system 300 according to an embodiment. BIST 300 includes a receiver 305 and a control unit 310. The control unit 310 may be any computing device configured to test various functions of the receiver 305 and provide data on the functionality, voltage and timing margins, and various other aspects of the receiver 305 as described herein. In this example, the various components of the receiver 305 are formed on a single integrated circuit die.

The receiver 305 includes a special purpose multiplexer 315. In this example, the multiplexer 315 has: (a) two input terminals A and B for receiving first and second input signals, respectively; and (b) an output terminal C for outputting an output signal in response to those input signals. Also, the multiplexer 315 has two selection terminals S1 and S2 for receiving two selection signals from the control unit 310 in this example.

In a first example, the first and second input signals (at the input terminals A and B respectively) are digital signals. In a second example, the first and second input signals (at the input terminals A and B respectively) are analog signals. As shown in the example of FIG. 3A: (a) the first input signal (at the input terminal A) is received from the control unit 310, which is a source external to the integrated circuit die of the receiver 305; and (b) the second input signal (at the input terminal B) is received from a dummy transmitter 350, which is a source within (internal to) the integrated circuit die of the receiver 305.

The multiplexer 315 outputs the output signal (at the terminal C) in response to the selection signals (at terminals S1 and S2) as shown in Table 1 below.

TABLE 1

| S1 | S2 | C |
|---|---|---|
| 0 | 0 | X |
| 0 | 1 | A |
| 1 | 0 | B |
| 1 | 1 | A + B |

Accordingly, in response to the selection signals (at terminals S1 and S2) having a binary value of "11," the multiplexer 315: (a) performs an analog summation of the input signals (from terminals A and B); and (b) outputs the analog summation as the output signal at the terminal C, so the output signal (which is the analog summation of those input signals) at the terminal C is a continuous analog signal, even if the input signals (from terminals A and B) are digital signals. Unlike the multiplexer 315, a conventional multiplexer would output only one of its input signals in response to its selection signal(s).

In response to the selection signals (at terminals S1 and S2) having a binary value of "00," the multiplexer 315 operates the terminal C to have an "X value" as shown in Table 1. The "X value" is an "invalid" state, such as a floating value (e.g., high impedance), a grounded zero value, a pulled high value or other value, according to needs of a particular implementation.

Further, in response to the selection signals (at terminals S1 and S2) having a binary value of "01" as shown in Table 1, the multiplexer 315 operates the terminal C to have the same value as the input signal from terminal A. Similarly, in response to the selection signals (at terminals S1 and S2) having a binary value of "10" as shown in Table 1, the multiplexer 315 operates the terminal C to have the same value as the input signal from terminal B.

Particular values of the selection signals (at terminals S1 and S2) are shown by example in Table 1, but the multiplexer 315 can be configured in other examples to generate the desired output C in response to different values of those selection signals. For example: (a) in a first alternative embodiment, in response to the selection signals (at terminals S1 and S2) having a binary value of "00," the multiplexer 315 operates the terminal C to have the same value as the input signal from terminal A, instead of having the "X value"; (b) in a second alternative embodiment, in response to the selection signals (at terminals S1 and S2) having the binary value of "00," the multiplexer 315 operates the terminal C to have the same value as the input signal from terminal B, instead of having the "X value"; and (c) in a third alternative embodiment, in response to the selection signals (at terminals S1 and S2) having the binary value of "00," the multiplexer 315 operates the terminal C to have the same value as an input signal from a third terminal D (not shown in FIG. 3A) of multiplexer 315, instead of having the "X value."

Also, in that third alternative embodiment, in response to the selection signals (at terminals S1 and S2) having a binary value of "11," the multiplexer 315: (a) performs an analog summation of the input signals (from terminals A, B and D); and (b) outputs the analog summation as the output signal at the terminal C, so the output signal (which is the analog summation of those input signals) at the terminal C is a continuous analog signal, even if the input signals (from terminals A, B and D) are digital signals.

The receiver 305 further includes an input buffer/driver 320 coupled to drive the output signal from the terminal C to other signal receiver circuits 330. An error detector 340 is coupled to: receive the output of circuits 330; compare that output with a predetermined input signal (e.g., test signal from the control unit 310); and (c) provide results of that comparison to the control unit 310 (and optionally to other units within or external to the integrated circuit die of the receiver 305). For example, in at least one embodiment, the error detector 340: (a) receives a predetermined pattern of expected output signals from the control unit 310; (b) compares that predetermined pattern to the output of circuits 330; and (c) provides results of that comparison to the control unit 310 (and optionally to other units within or external to the integrated circuit die of the receiver 305). In a first example, the output of the error detector 340 is a binary pass/fail indication (and optionally to other units within or external to the integrated circuit die of the receiver 305) of that comparison. In a second example, the output of the error detector 340 is a detailed report of that comparison.

A clock generator 360 is coupled to provide a clock signal for the receiver 305 operations. For clarity, although FIG. 3A shows the clock generator 360 connected to only the circuits 330 and the dummy transmitter 350 within the receiver 305, the clock generator 360 is further coupled to other components within the receiver 305. As shown in FIG. 3A, the clock generator 360 includes an integrated phase rotator (shifter) 362. In another example, the phase shifter is external to the clock generator 360. The clock generator 360 generates a clock frequency for the receiver 305 to operate at a desired speed. The control unit 310 is coupled to provide various control signals to the clock generator 360 via control signal line 365, such as control signals for freezing the internal clock at a desired frequency (e.g., central frequency of a data eye diagram), changing/rotating the phase of the internal clock signal to determine the timing margin of the receiver 305, and others as explained herein. If the phase shifter is external to the clock generator 360, then the control unit 310 is coupled to provide suitable phase shift control signals to that external phase shifter.

The dummy transmitter 350 is configurable (e.g., programmable) to generate predetermined test signal patterns. As shown in FIG. 3A, the dummy transmitter 350 is coupled to output those predetermined test signal patterns to the receiver circuits 330 via the multiplexer 315 and the buffer/driver 320. More specifically, the dummy transmitter 350 outputs those predetermined test signal patterns via a signal line 355 connected to input terminal B of the multiplexer 315. The predetermined test signal patterns can be any form of pseudo-random binary sequence ("PRBS") pattern, such as a series of logical "1" (e.g., positive voltage), logical "0" (e.g., negative voltage), or other predetermined signal patterns configured to test the functionality of receiver 305 under various conditions. The test signal patterns' amplitude is continuously variable (adjustable) by the dummy transmitter 350 in response to suitable control signals that it receives from the control unit 310, in accordance with the configuration (e.g., programming) thereof, which advantageously enables fine tuning of the receiver 305 operations. Accordingly, as discussed hereinabove, the control unit 310 monitors the comparison results that are output from the error detector 340. In response to those comparison results (and optionally other factors), the control unit 310 outputs the suitable control signals to the dummy transmitter 350, which adjusts (continuously increases/decreases) the test signal patterns' amplitude in response thereto, thereby determining a voltage margin for causing the receiver 305 to function within its optimal capacity.

The timing margin of receiver 305 is determinable by adjusting the phase of its internal clock from the clock generator 360. For example, the control unit 310 may initially output suitable control signals for causing the clock generator 360 to freeze a phase of the internal clock at a particular frequency (e.g., center of an ideal data eye diagram) and then rotate/change the phase of the internal clock, so the control unit 310: determines an impact of those phase rotations/changes by monitoring the comparison results that are output from the error detector 340; and thereby measures the timing margin of the receiver 305. If the phase shifter is external to the clock generator 360 (as discussed in another example hereinabove), then the control unit 310 outputs suitable control signals for causing that external phase shifter to generate an arbitrary clock phase for the receiver circuits 330 and then adjust the phase in various directions (e.g., advanced or delayed) to determine the timing margin of the receiver 305.

The control unit 310 is further coupled to directly output configurable (e.g., programmable) test signal patterns via input terminal A of multiplexer 315. Those test signal patterns (from the control unit 310 via input terminal A) are combinable with the other test signal patterns (from the dummy transmitter 350 via input terminal B) by the control unit 310 suitably controlling the terminals S1 and S2 of multiplexer 315 to have the binary value of "11" as discussed hereinabove. By suitably combining those test signal patterns in that manner, the control unit 310 adjusts amplitude of the other test signal patterns (from the dummy transmitter 350 via input terminal B), in accordance with the configuration (e.g., programming) thereof, so the control unit 310 determines an impact of those amplitude adjustments by monitoring the comparison results that are output from the error detector 340.

Further, as discussed hereinabove, the control unit 310 is configured to output suitable control signals for causing: (a) the dummy transmitter 350 to adjust the test signal patterns' amplitude at input terminal B of the multiplexer 315; and (b) the clock generator 360 to change/rotate the phase of the internal clock signal of the receiver 305. Accordingly, by causing the receiver 305 to operate under various combinations of test signal patterns, amplitudes and clock phases, the control unit 310 determines a more complete functional profile of the receiver 305. For example, by monitoring the comparison results that are output from the error detector 340 during such a test, the control unit 305 may generate a data eye diagram to determine functional margins (e.g., voltage and timing) of the receiver 305.

Figure 3B:
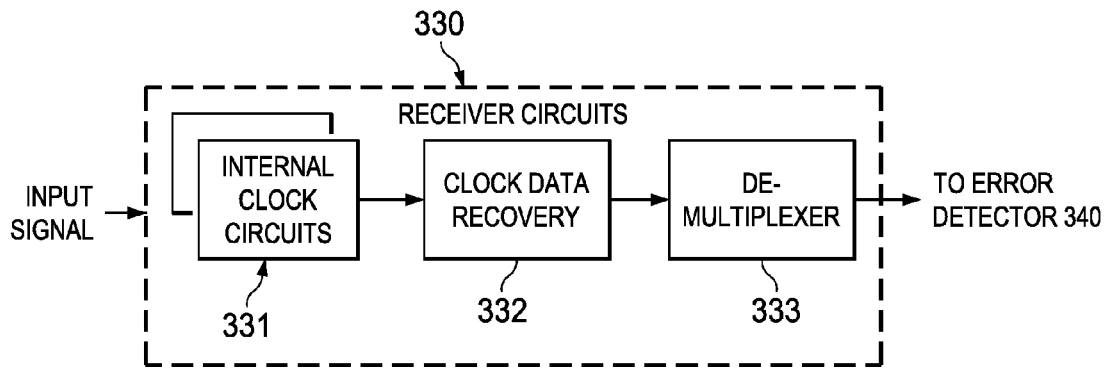
FIG. 3B is a block diagram of an example of receiver circuits of the system of FIG. 3A.

FIG. 3B shows an example of the receiver circuits 330 (FIG. 3A). In this example, the receiver circuits 330 include internal clock circuits 331 coupled to provide local clock signals (for various internal functional units) in response to the signal from buffer/driver 320. A clock data recovery unit 332 is coupled to recover data and clock signals from outputs of the circuits 331. A demultiplexer 333 is coupled to provide the receiver circuits 330 output signal to the error detector 340 by demultiplexing output(s) of the unit 332. For clarity, FIG. 3B shows single signal lines between its components, but those components may be connected by multiple signal lines, based on a number of bit lines used in the receiver 305. Further, the receiver circuits 330 and the receiver 305 may include many other internal elements (not shown).

Figure 4A:
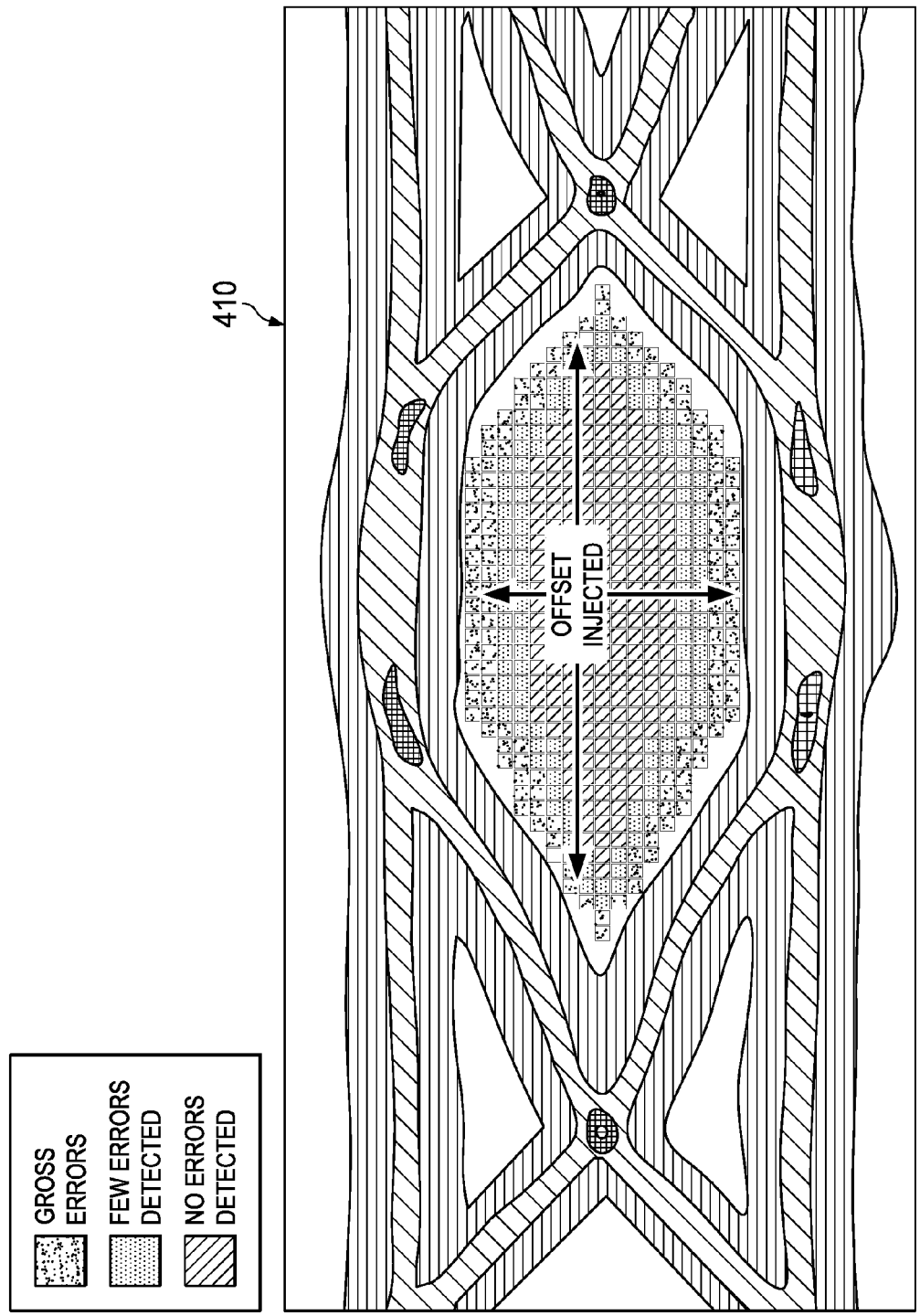
FIG. 4A is an example data eye diagram of a built-in self-test function of a receiver according to an embodiment.

FIG. 4A shows an example data eye diagram 410 of a BIST function of a receiver, such as receiver 305, according to an embodiment. The "opening" of eye in the data eye diagram 410 can be measured using various offsets for clock phase and amplitude of test signal patterns. For example: (a) when amplitude of the test pattern is changed, the eye may expand/retract in the vertical direction; and (b) when the phase of the clock is changed, the eye may expand/retract in the horizontal direction. As shown in FIG. 4A, the central portion of the eye may provide an acceptable working range of the receiver (e.g., receiver 305). As the clock phase and test amplitudes are pushed toward the edge of the eye, the error rate may increase to provide a detailed view of the receiver's functional margins (voltage and timing).

An error detector in the receiver (e.g., error detector 340) can compare an expected received data pattern against the actual received data pattern. If the input to the receiver is the same pattern as expected by the error detector, then the error detector outputs an indication of no error. Eventually, as the level of offset injected by the dummy transmitter 350 increases, the offsets will be larger than the input signal, the receiver sensitivity will be compromised, and errors are detected by the error detector. By monitoring the error detector's output and adjusting the amplitude of the test pattern, the sensitivity of the receiver can be determined.

As shown in FIG. 4A, in the "middle" of the eye, the receiver sensitivity and the available signal are sufficient to overcome any offset injected by the dummy transmitter 350. Initially, few errors are detected by the error detector as the edges of the signal amplitude are approached. When the amplitude of the injected offset increases, a high number of errors is generated. Using this adjustment, receiver sensitivity can be fully determined and characterized.

Figure 4B:
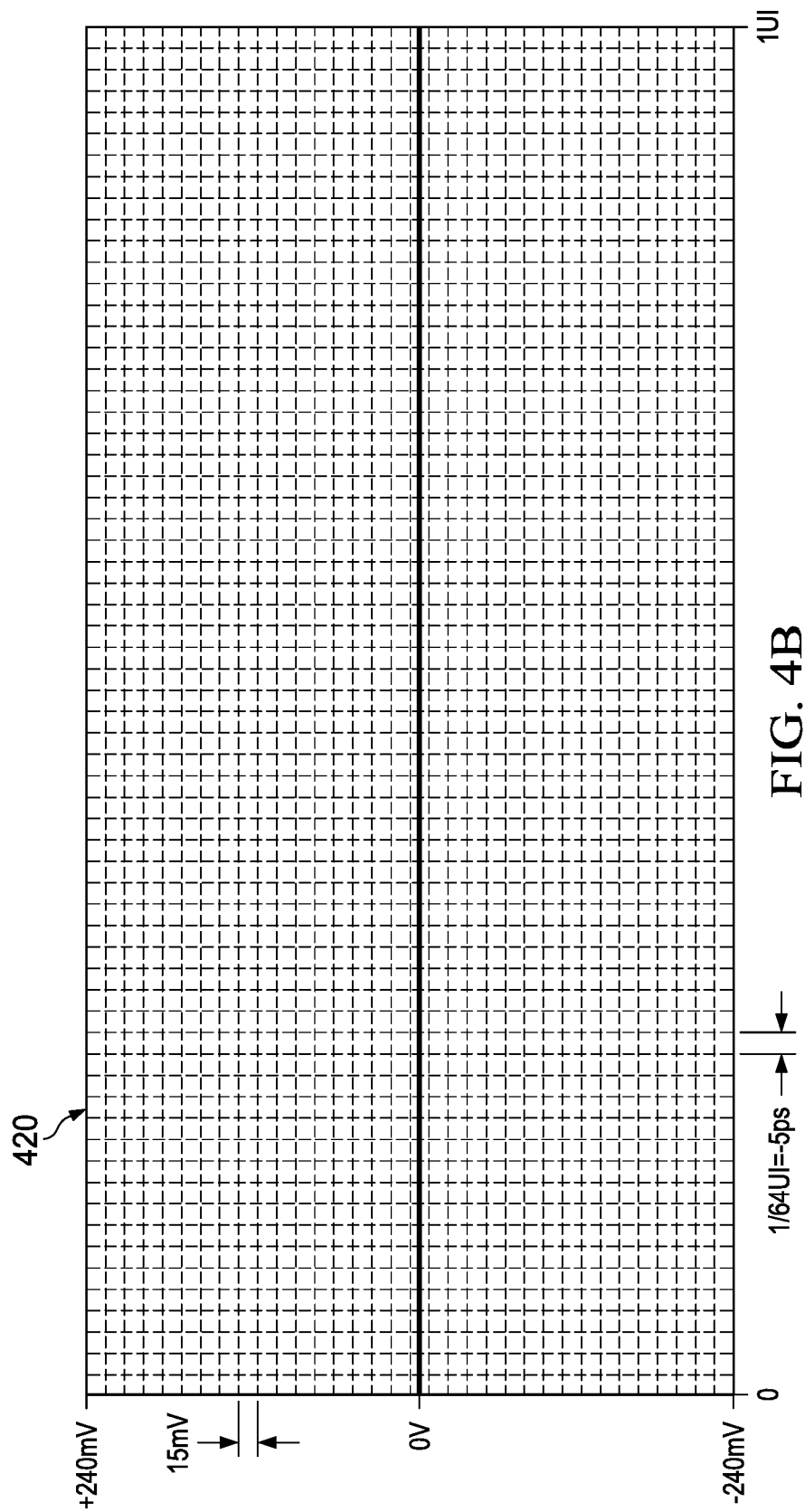
FIG. 4B is a graph of a timing and voltage scale for the example data eye diagram of FIG. 4A.

FIG. 4B shows a timing and voltage scale 420 for the example data eye diagram 410 (FIG. 4A). For a data speed of 3.2 Gbps, 64 timing unit steps (of approximately 4.88 ps apiece) span the 312.5 ps of a bit unit interval (UI) and are useful for margin testing. Similarly, 32 amplitude steps (of 15 mV apiece) span a total voltage range of +/−240 mV and are useful for voltage margin testing. By causing the receiver 305 to operate under various combinations of these offsets, the control unit 310 measures numerous timing and voltage offset points (inside of the received signal's data eye) to determine whether error free data is received by the error detector 340. For example, the control unit 310 uses these measurements to assess the functionality of the clock data recovery unit 332 (FIG. 3B). The steps or "slices" of frequency and voltage are useful for sensitivity measurement in both the timing and voltage domains, thereby enabling the control unit 310 to generate the "eye" profile of the data eye diagram. By suitably programming the phase of the clock and adding the vertical sensitivity measurement (provided by the dummy transmitter 350), the control unit 310 maps the entire profile of the "eye". To generate a given profile of the receiver 305, this example uses 15 mV and 4.88 ps, but any number and size of steps can be used, based on a given device's voltage and clock rating.

Figure 5:
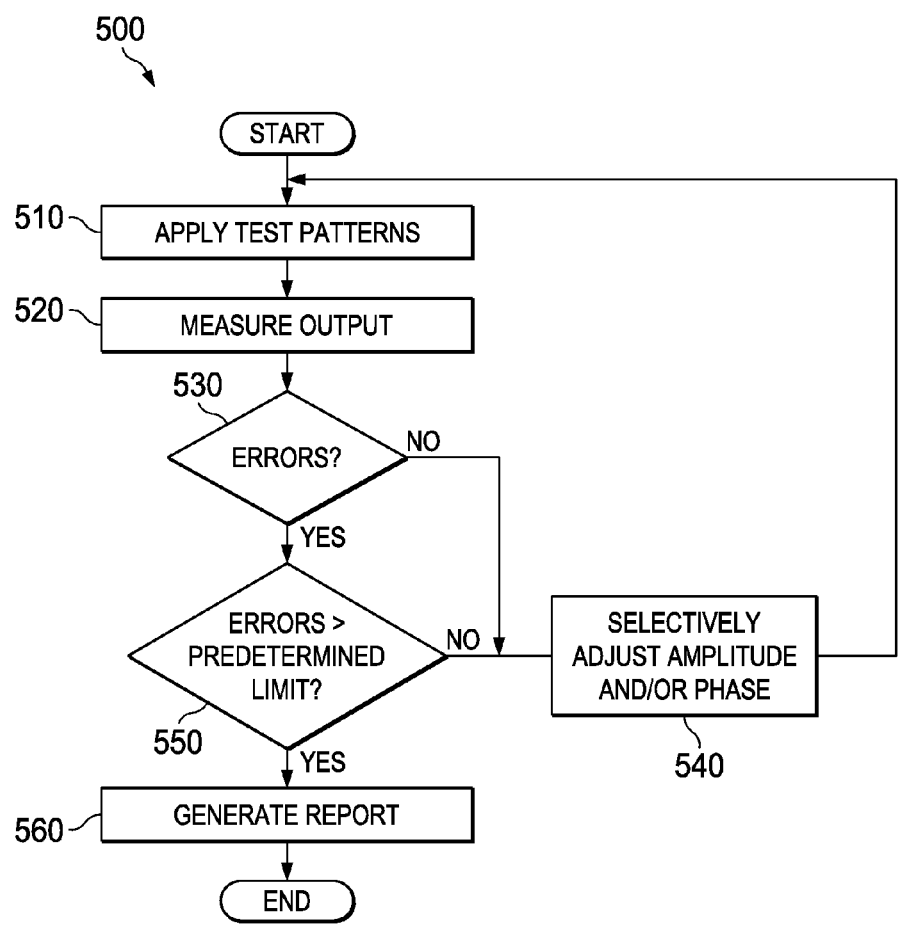
FIG. 5 is a flowchart of an example process for measuring voltage and timing margin of a device using built-in self-test system according to an embodiment.

FIG. 5 shows an example process 500 for measuring voltage and timing margins of a device (e.g., the receiver 305) using BIST according to an embodiment. Initially at 510, the control unit 310 applies a predetermined test pattern to the receiver 305. As discussed hereinabove in connection with FIG. 3A, the predetermined pattern may include applying a pseudo-random binary sequence from the dummy transmitter 350, applying a test pattern from the control unit 310, and/or a combination thereof. At 520, the control unit 310 measures (either directly or via the error detector 340) the output of the receiver circuits 330 to determine whether the output matches a predetermined pattern of expected output signals. In at least one example, the error detector 340 receives that predetermined pattern from the control unit 310 and determines whether the output of the receiver circuits 330 matches that predetermined pattern. At 530, the control unit 310 determines (e.g., by receiving results of the error detector 340 comparison) whether the output of the receiver circuits 330 includes error.

If the control unit 310 determines (at 530) that the output of the receiver circuits 330 does not include any error, then the control unit 310 selectively adjusts (at 540) the amplitude of the test signal and/or the phase of the clock using predetermined steps (such as the timing unit steps and amplitude steps discussed hereinabove in connection with FIGS. 4A and 4B). As discussed hereinabove, the control unit 310 is able to selectively adjust the amplitude of the test signal and/or the phase of the clock individually or in a combination thereof, and/or optionally with other offsets, based on the measurement model to be used for the receiver 305. After adjusting the amplitude and/or phase in that manner (at 540), the control unit 310 applies (at 510) the test pattern with such adjusted amplitude and/or phase (and optionally with such other offsets) to the receiver 305 for the next measurement.

If the control unit 310 determines (at 530) that the output of the receiver circuits 330 includes errors, then the control unit 310 determines (at 550) whether the number of errors exceeds a predetermined limit. The predetermined limit can be based on the "structure" of the data eye diagram. For example, if the applied offset stretches the "eye" to its outer limits (horizontal and/or vertical), then the number of errors may increase.

Also, the predetermined limit can be based on the device (e.g., receiver 305) ratings and the signal error tolerance limit. For example, if the device is used for certain precision based applications, then even a small number of errors may be unacceptable, so the predetermined error limit could be set to a conservatively low number. Or, if the device is used for certain high error tolerance applications, then the predetermined error limit could be set to a liberally high number.

If the control unit 310 determines (at 550) that the number of errors does not exceed the predetermined limit, then the control unit 310: (a) selectively adjusts (at 540) the amplitude of the test signal and/or the phase of the clock using predetermined steps; and (b) applies (at 510) the test pattern with such adjusted amplitude and/or phase (and optionally with such other offsets) to the receiver 305 for the next measurement. Or, if the control unit 310 determines (at 550) that the number of errors exceeds the predetermined limit, then such number may indicate the outer boundaries of the receiver 305 range, so the control unit 310 generates (at 560) a report thereof. In at least one example, the report includes the measured data eye diagram and related parameters, including: (a) the shape and form of the data eye diagram at various stages of the test patterns; and (b) values of signal amplitude and/or clock phase at those stages.

Modifications are possible in the described embodiments, and other embodiments are possible, within the scope of the claims. For example, operations are not necessarily required to occur in the particular order described herein. Also, some operations may be unnecessary in some embodiments.

What is claimed is:

1. A device comprising:
   a multiplexer having at least first and second input terminals and coupled to receive a first input signal at the first input terminal, to receive a second input signal at the second input terminal, to receive selection signals, and to output: the first input signal in response to a first combination of the selection signals; the second input signal in response to a second combination of the selection signals; and an analog summation of the first and second input signals in response to a third combination of the selection signals, wherein the output analog summation is for testing the device.

2. The device of claim 1, further comprising:
   a transmitter coupled to: provide the second input signal to the multiplexer; and selectively change an amplitude of the second input signal in response to a first control signal;

a phase shifter coupled to selectively change a phase of a clock signal to the transmitter in response to a second control signal, wherein a phase of the second input signal is selectively adjustable by selectively changing the phase of the clock signal.

3. The device of claim 2, further comprising:
at least one receiver circuit coupled to provide at least one local signal in response to the output of the multiplexer; and
an error detector coupled to generate at least one comparison signal to indicate whether the at least one local signal matches an expected output of the at least one receiver circuit.

4. The device of claim 3, wherein the first and second control signals are provided by a control unit in response to the at least one comparison signal from the error detector.

5. The device of claim 4, wherein the second input signal is a predetermined test signal pattern.

6. The device of claim 5, wherein the predetermined test signal pattern is a pseudo-random binary sequence pattern.

7. The device of claim 4, further comprising:
an input buffer coupled to the output of the multiplexer;
wherein the at least one receiver circuit includes: at least one internal clock circuit coupled to an output of the input buffer; a clock data recovery unit coupled to at least one output of the at least one internal clock circuit; and a demultiplexer coupled to an output of the clock data recovery unit;
wherein an output of the demultiplexer is the at least one local signal.

8. A method comprising:
generating a first signal;
providing the first signal to a first input terminal of a multiplexer;
generating a second signal;
providing the second signal to a second input terminal of the multiplexer;
with the multiplexer, generating a third signal as an analog summation of the first and second signals; and
from the multiplexer, providing the third signal to test a device.

9. The method of claim 8, wherein generating the first and second signals includes:
measuring an output signal of the device;
determining whether the output signal of the device has at least one error; and
in response to determining that the output signal of the device does not have at least one error, adjusting at least one of: an amplitude of the first signal; an amplitude of the second signal;
and a phase of the second signal.

10. The method of claim 9, wherein determining whether the output signal of the device has at least one error includes:
determining whether the output signal of the device matches a predetermined pattern; and
in response to determining that the output signal of the device matches the predetermined pattern, determining that the output signal of the device does not have at least one error.

11. The method of claim 8, wherein the second signal is a predetermined test signal pattern.

12. The method of claim 11, wherein the predetermined test signal pattern is a pseudo-random binary sequence pattern.

13. An integrated circuit comprising:
a multiplexer having at least first and second input terminals and coupled to receive a first input signal at the first input terminal, to receive a second input signal at the second input terminal, to receive selection signals, and to output: the first input signal in response to a first combination of the selection signals; the second input signal in response to a second combination of the selection signals; and an analog summation of the first and second input signals in response to a third combination of the selection signals;
a transmitter, coupled to the multiplexer, to: provide the second input signal to the multiplexer; and selectively change an amplitude of the second input signal in response to a first control signal;
a phase shifter, coupled to the transmitter, to selectively change a phase of a clock signal to the transmitter in response to a second control signal, wherein a phase of the second input signal is selectively adjustable by selectively changing the phase of the clock signal;
at least one receiver circuit, coupled to the multiplexer, to provide at least one local signal in response to the output of the multiplexer;
an error detector, coupled to the at least one receiver circuit, to generate at least one comparison signal to indicate whether the at least one local signal matches an expected output of the at least one receiver circuit; and
a control unit, coupled to the error detector, to provide the first input signal, the selection signals, and the first and second control signals in response to the at least one comparison signal from the error detector.

14. The integrated circuit of claim 13, wherein the second input signal is a predetermined test signal pattern.

15. The integrated circuit of claim 14, wherein the predetermined test signal pattern is a pseudo-random binary sequence pattern.

16. The integrated circuit of claim 13, further comprising:
an input buffer coupled to the output of the multiplexer;
wherein the at least one receiver circuit includes: at least one internal clock circuit coupled to an output of the input buffer; a clock data recovery unit coupled to at least one output of the at least one internal clock circuit; and a demultiplexer coupled to an output of the clock data recovery unit;
wherein an output of the demultiplexer is the at least one local signal.

\* \* \* \* \*